(12) United States Patent
Weekamp et al.

(10) Patent No.: US 7,942,551 B2
(45) Date of Patent: May 17, 2011

(54) LED ARRAY GRID, METHOD AND DEVICE FOR MANUFACTURING SAID GRID AND LED COMPONENT FOR USE IN THE SAME

(75) Inventors: Johannes W. Weekamp, Eindhoven (NL); Cornelis Slob, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 243 days.

(21) Appl. No.: 12/298,281

(22) PCT Filed: Apr. 19, 2007

(86) PCT No.: PCT/IB2007/051416
§ 371 (c)(1),
(2), (4) Date: Oct. 23, 2008

(87) PCT Pub. No.: WO2007/122566
PCT Pub. Date: Nov. 1, 2007

(65) Prior Publication Data
US 2009/0091932 A1 Apr. 9, 2009

(30) Foreign Application Priority Data

Apr. 25, 2006 (EP) .................................... 06113035
Dec. 8, 2006 (EP) .................................... 06125674

(51) Int. Cl.
*F21S 4/00* (2006.01)
(52) U.S. Cl. .................... 362/249.02; 362/234; 362/253
(58) Field of Classification Search ........ 362/249.02–249.06, 230, 231, 362/800, 253, 234
See application file for complete search history.

(56) References Cited

U.S. PATENT DOCUMENTS

| 6,386,733 B1 * | 5/2002 | Ohkohdo et al. ........ 362/249.06 |
| 2003/0090910 A1 | 5/2003 | Chen |
| 2004/0252501 A1 | 12/2004 | Moriyama et al. |
| 2005/0231947 A1 | 10/2005 | Sloan et al. |

FOREIGN PATENT DOCUMENTS

| EP | 0125632 B1 | 11/1984 |
| EP | 0645748 A1 | 3/1995 |
| WO | 2003081967 A1 | 10/2003 |
| WO | 2005084848 A1 | 9/2005 |

OTHER PUBLICATIONS

Stephanie P. Lacour et al; "Stretchable Interconnects for Elastic Electronic Surfaces" Proceedings of the IEEE, vol. 93, No. 8, Aug. 2005.
Rabin Bhattacharya et al; "Organic LED Pixel Array on a Dome", Proceedings of the IEEE, vol. 93, No. 7, Jul. 2005.
Rabin Bhattacharya et al; "Fabricating Metal Interconnects for Circuits on a Spherical Dome", J. Electrochem. Soc. vol. 153, Issue 3, pp. G259-G265, 2006, Dept. Of Electrical Eng., Princeton, University.

* cited by examiner

*Primary Examiner* — Bao Q Truong

(57) ABSTRACT

Disclosed herein is a method for producing an LED array grid including the steps of (i) arranging N electrically conducting parallel wires, where N is an integer>1, thus creating an array of wires having a width D perpendicular to a direction of the wires, (ii) arranging LED components to the array of wires such that each LED component is electrically coupled to at least two adjacent wires, (iii) stretching the array of wires such that the width D increases, and arranging the stretched LED array grid onto a plate or between two plates.

14 Claims, 7 Drawing Sheets

LED ARRAY GRID, METHOD AND DEVICE FOR MANUFACTURING SAID GRID AND LED COMPONENT FOR USE IN THE SAME

This application is a national stage application under 35 U.S.C. §371 of International Application No. PCT/IB2007/051416 filed on Apr. 19, 2007, and published in the English language on Nov. 1, 2007, as International Publication No. WO2007/122566, which claims priority to European Application No. 06113035.7 filed on Apr. 25, 2006, and European Application No. 06125674.9 filed on Dec. 8, 2006, all of which are hereby incorporated herein by reference.

TECHNICAL FIELD

The present invention relates to a method for production of an illumination system, an illumination system produced with said method, and a winding device.

TECHNICAL BACKGROUND

Light emitting diodes (LEDs) have been used as backlight for displays and illumination panels for some time, where a large number of low power LEDs are arranged in an array. LEDs are well suited for this purpose for several reasons. They are, for instance, durable structures with a long lifetime, which reduces the maintenance needed. Also, they have a low power consumption and are operated at lower voltages, which reduces costs of operation and risks related to high voltage applications. In relation to this they have an high light output. Prior art techniques include the arrangement of LEDs on printed circuit boards (PCBs). This is, however a costly solution, especially when the LEDs are on a large pitch an larger areas are to be illuminated.

SUMMARY OF THE INVENTION

In order to provide a LED array that is suitable for the above and other purposes where a large area illumination is needed and at the same time solving the drawbacks in prior art solutions the present invention provides a method for production of a LED array grid, comprising the steps of:
  arranging N electrically conducting wires ($W_1$-$W_N$) in parallel, where N is an integer >1, thus creating an array of wires, said array having a width D perpendicular to a length direction of the wires,
  arranging LED components to the array of wires such that each LED component is electrically coupled to at least two adjacent wires,
  stretching the array of wires such that the width D increases.

By using low cost assembly processes on very small printed circuit boards and a novel design of these boards it is possible to make the interconnects for large area arrays with wires by a simple winding/soldering process. The novel design of the PCBs refers to that the resulting LED components preferably are adapted for use in the inventive method by the provision of dedicated locations on the LED components adapted for contact with the wire, e.g. locations in which the electrical contact is facilitated and/or the wire is kept in position. Further, the use of a wire instead of a large area printed circuit board further decreases the cost for the LED array grid. By using the inventive method it is possible to achieve several advantages in comparison to known techniques. According to the method the production steps can be performed in a limited space, which facilitates operation reduces construction costs, while the end result can be a large LED array grid with any desired pitch.

According to one or more embodiments the LED components are arranged such that the LED components are regularly distributed after stretching of the grid and in one or more embodiments the LED components are arranged such that, in a direction perpendicular to the length direction of the wires, there is a row of LED component bridging every other gap between adjacent wires.

In one or more embodiments adjacent rows of LED components are shifted such that if a first row bridges every other gap between adjacent wires starting at a first gap, the adjacent row bridges every other gap between adjacent wires starting at an adjacent gap. When stretched this can result in a LED array grid where the wires forms diamond-shaped openings.

In one or more embodiments the rows are arranged in row pairs and wherein adjacent row pairs of LED components are shifted in such a way that if a first row pair bridges every other gap between adjacent wires starting at a first gap, the adjacent row pair bridges every other gap between adjacent wires starting at an adjacent gap. After stretching this arrangement can result in a LED array grid with equidistant rows and columns.

In one or more embodiments the array of wires are formed by winding a wire in a helical fashion around an assembly drum and wherein a winding of the array of wires can leave the assembly drum after the step of securely fixing each LED component to said two adjacent wires included in the winding is finalized, thus creating a cylinder shaped grid of wires and LED components. The use of an assembly drum makes it possible to generate a continuous assemble process where components are fed in one end and a refined product is achieved in the other.

In one or more embodiments the method further comprises the step of cutting the wire at least once along each winding of the cylinder shaped grid. This step is beneficial in the cases where a planar LED array grid is desired.

The LED components are preferably soldered, glued or similar to the wires or comprise IDC type fasteners (IDC—insulation displacement connector) in order to provide a durable LED array grid and ensure a reliable electrical contact.

According to one or more embodiments the method further comprises the steps of:
  preparing a leadframe material for a substrate,
  folding the substrate in order to obtain "snap-lock" positions for a wire,
  placing/interconnecting LEDs by means of wire bonding or flip-chip,
  over moulding the LEDs with a clear compound
  back etch carrier substrate,
  dice into components.

The resulting LED components are suitable for use in the inventive LED array grid, as well as for other applications.

The invention also relates to a winder device for production of a LED array grid, which winder device according to one embodiment comprises rotatable pins extending essentially in the same direction and being arranged along a circumference, thus forming a winding drum, wherein said rotatable pins are provided with threads adapted to effectively locate an electrically conducting wire being wound around the drum, thus creating a parallel array of wires,
  wherein rotation of said pins transports the array of wires along the length of the pins,
  said device further comprising means for arranging LED components to the array of wires, and means for securely fixing each LED component to said two adjacent wires.

The winder device is well suited for production of the inventive LED array grid.

In one or more embodiments the winder device further comprises a gear coupling the rotation of the drum to the rotation of each of the pins such that one revolution of the drum results in one revolution of each pin. This feature results in that one "turn" of the resulting cylindrical LED array grid will be wound of the drum during each revolution of the drum. This means that the rate at which the grid is fed off the device equals the rate at which the wire is fed onto the device, which is beneficial.

DETAILED DESCRIPTION OF PREFERRED EMBODIMENTS

Figure 1:
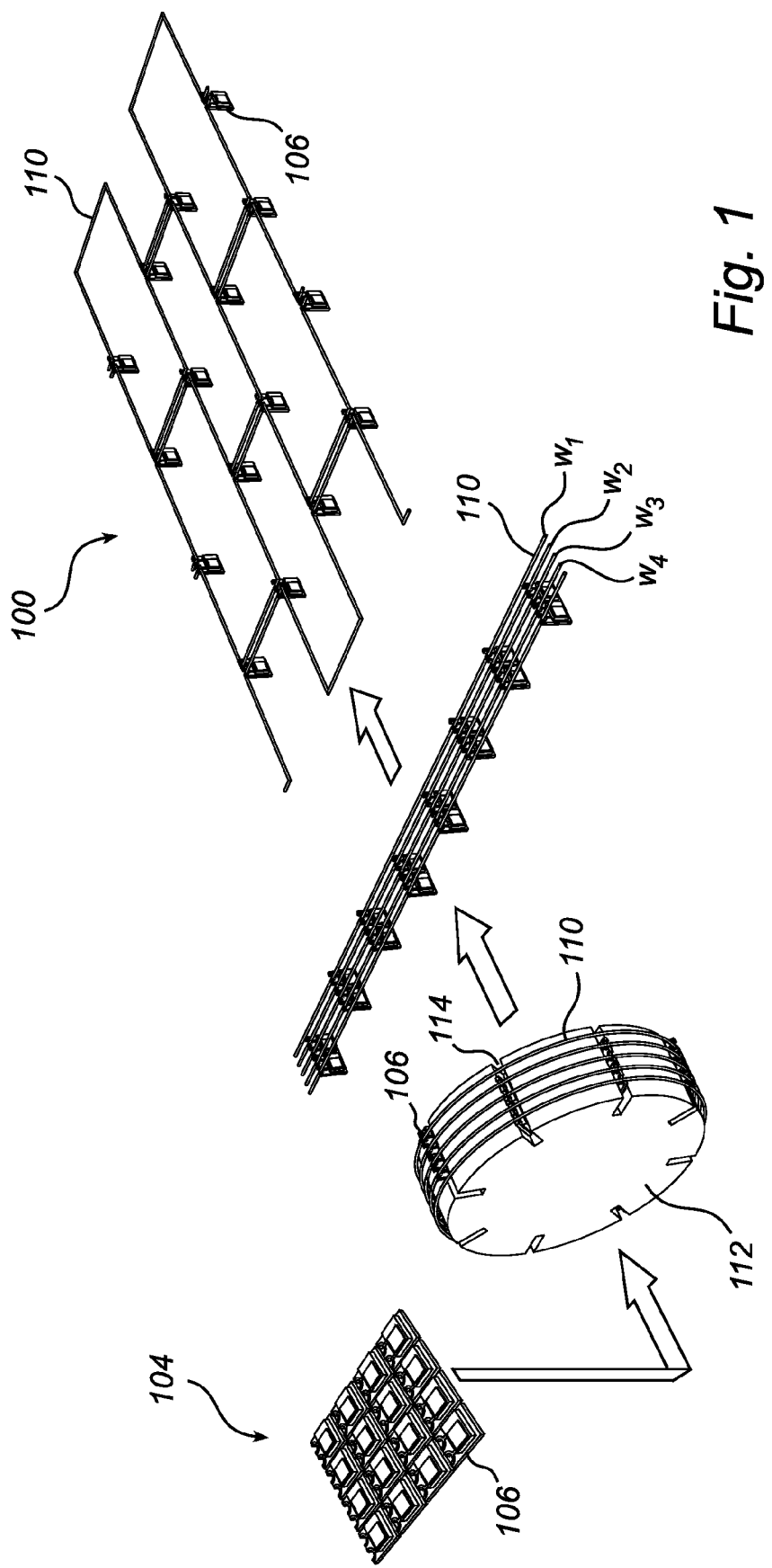
FIG. 1 is a graphical flowchart showing an outline of one embodiment of the inventive method.

FIG. 1 shows the main steps of the inventive method. It illustrates an example of how LEDs 102 for use in the present invention can be arranged on a PCB 104, see also FIG. 2. The LEDs 102 can be prepackaged LEDs or naked dyes. In this example the PCB 104 is provided with a specific hole pattern and when the PCB 104 is diced into separate LED components 106 the holes 108 can be defined such as to provide attachment points used in a soldering process later on in the inventive method. It is cost efficient to arrange the LEDs 102 with a low pitch on a PCB 104 and to make as much use of the PCB material as possible.

After this preparing step the actual assembly takes place. A wire 110 is wound around an assembly drum 112, to be described in more detail later, and the separate LED components 106 are arranged in specific slots 114 that locates them before the wire 110 is wound into the holes 108 forming the attachment points. The wire is generally indicated with 110, while each individual "turn" of the wire is designated $W_n$, n=1, 2 etc, $W_1$ being the first turn of the wire 110, $W_2$ the second, and so forth. The assembly drum 112 rotates so that a feed device, schematically shown at 116 in FIG. 4, which feed device 116 contains a set of LED components 106, can be a fixed device in the sense that it does not need to move in order to position the LED components 106 correctly in the slots 114. This also means that equipment, such as soldering devices (not shown), can have a fixed location.

While the assembly drum 112 rotates, the wire 110 being wound on the drum 112 will gradually be fed off the drum, which also will be described later on in relation to FIGS. 4 and 5.

The assembly process can continue indefinitely or, in practice, as long as needed. The thus created, cylindrical, LED array grid is generally cut and unfolded, which is shown as the next illustrative step in the flow chart of FIG. 1. Finally the LED array grid is stretched to create a large area LED array grid 100, the size of which is adapted to its intended use. From FIG. 1 and the above description it should be clear that a width of the grid, being a function of the diameter (or the circumference) of the assembly drum 112, is limited, while the length if the LED array grid 100 is infinite, at least theoretically. Some processing steps in order to obtain the final lighting product remains. It should be mentioned that soldering is only one example of a fastening technique that could be used. There are alternatives such as laser welding, ultrasonic techniques, etc.

Obviously, the arrangement can be the opposite, i.e. the drum 112 is static while other equipment revolves around it. Combinations of these two extremes are also anticipated.

Figure 2:
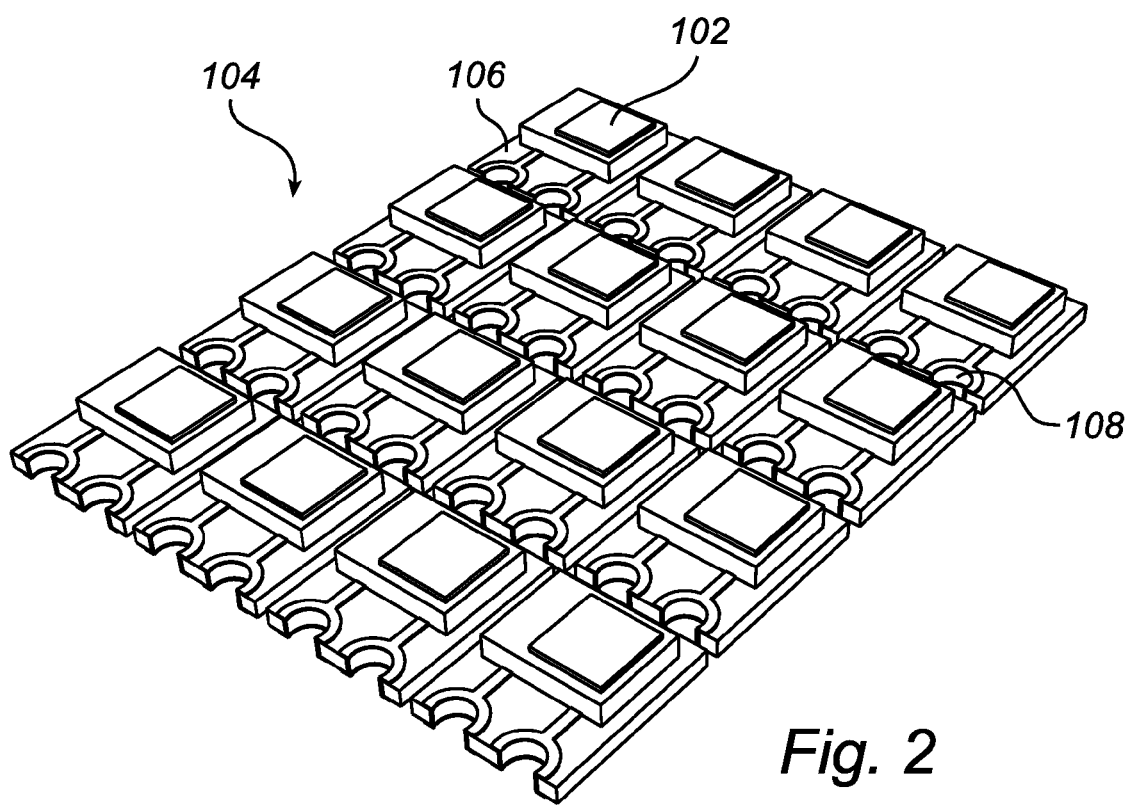
FIG. 2 is a perspective view illustrating LED components arranged on a PCB used for a soldered version.

FIG. 2 illustrates a small pitch assembly of LEDs 102 on a PCB material. The assembly is shown after being diced into individual LED components 106. It can be noticed how the dicing is offset so as to transform the holes 108 into suitable soldering points.

Figure 3A:
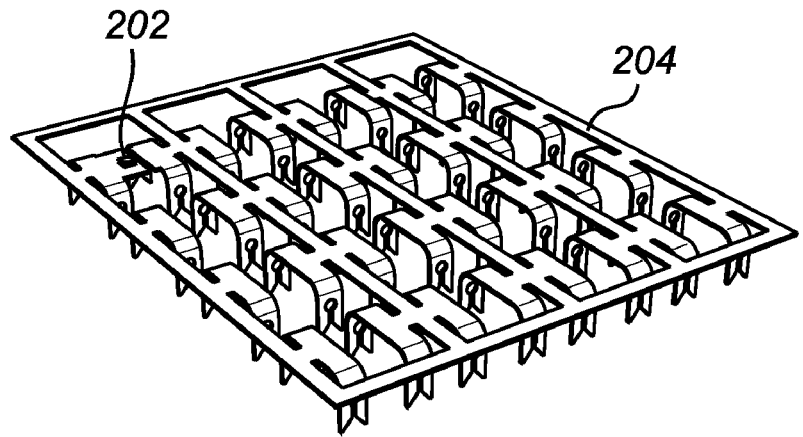
FIG. 3a-c are perspective views illustrating the production steps for LED components that are of IDC (insulation displacement connector) type.
Figure 3B:
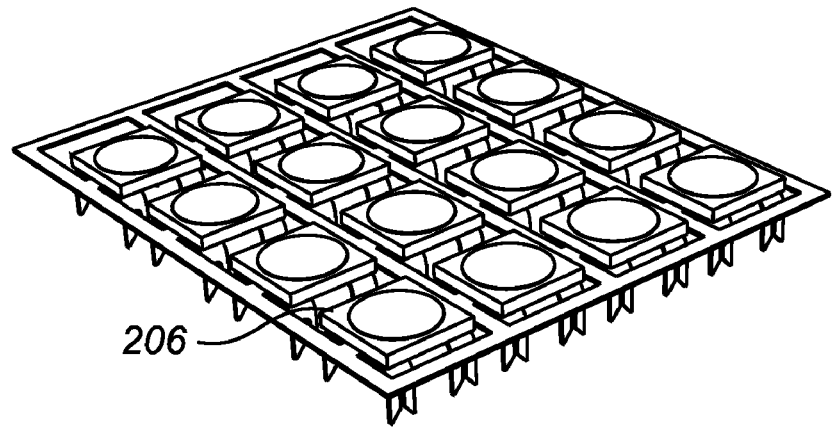
Figure 3C:
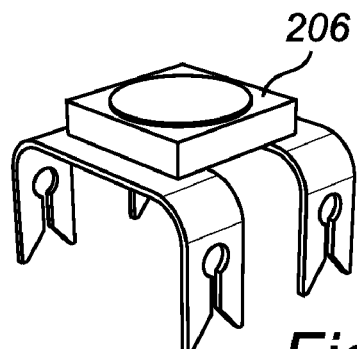

FIG. 3a-c illustrates a few steps in the construction of IDC-type LED components 206. It is shown how LEDs 102 are arranged on a metal substrate 204 or lead frame, after which the substrate 204 is cut or punched into separate LED components 206 (see FIG. 3c). An advantage with the IDC-type LED components 206 is that they do not have to be soldered onto the wire 100. Also, the wire 100 could be insulated while still permitting the IDC-type LED components 206 to be fastened and electrically connected to the wire 100. The use of IDC-type LED components 206 makes the step of attaching the LED components 206 to the wire 100 a bit more flexible. The LED components can be arranged in a slot, corresponding to slot 114 prior to the wire 110 being wound around the assembly drum 112, but they could equally well be arranged on the wire 110 after said wire have been wound onto the assembly drum 112.

Figure 4:
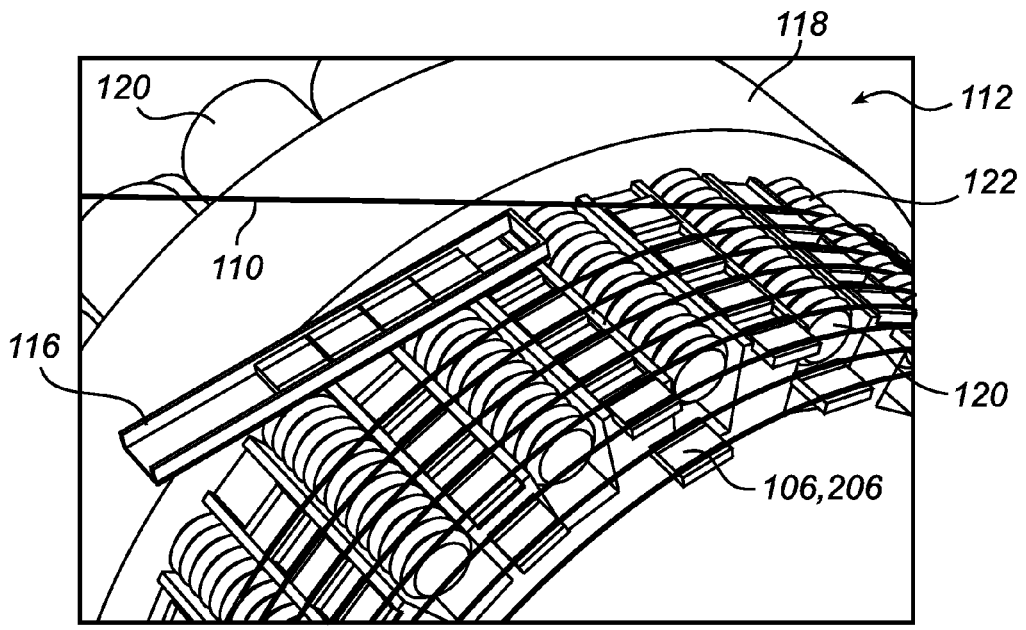
FIG. 4 is a perspective partial view showing details of a device performing the inventive method.

FIG. 4 illustrates a detail of the assembly drum 112 during an assembly process. The drum 112 has a main body 118 which rotates around an axis A with a predetermined speed. The drum 112 also comprise rotating pins 120. These pins 120 are driven to rotate, e.g., by a belt or gears (not shown) as the drum 112 rotates. The pins 120 are on one end provided with coarse threads 122, as shown in FIGS. 4 and 5. As the drum 112 rotates a wire 100 is wound onto the drum 112 and positioned by the threads 122. The rotation of the pins 120 will, by means of the threads 122, gradually feed the wire 100 off the assembly drum 112. At the same time the rotating pins 120 are the operative part onto which the wire 100 is wound. Between adjacent pins, on their threaded end, the LED locating slots 114 are arranged. These serves to, together with the wire 110, locate the LED components 106 until they are fastened to the wire 110. A component feed device 116 is arranged to position LED components 106, 206 in the locating slots, after which the components can be fastened to the wire 110. The rotation of the drum body 118, the rotation of the rotating pins 120, and the pin threads 122 are so arranged that the component feed device 116, as well as the fastening of LED components 106, 206, can take place in a fixed position, which makes it possible to simplify the equipment needed for these operations.

Figure 5:
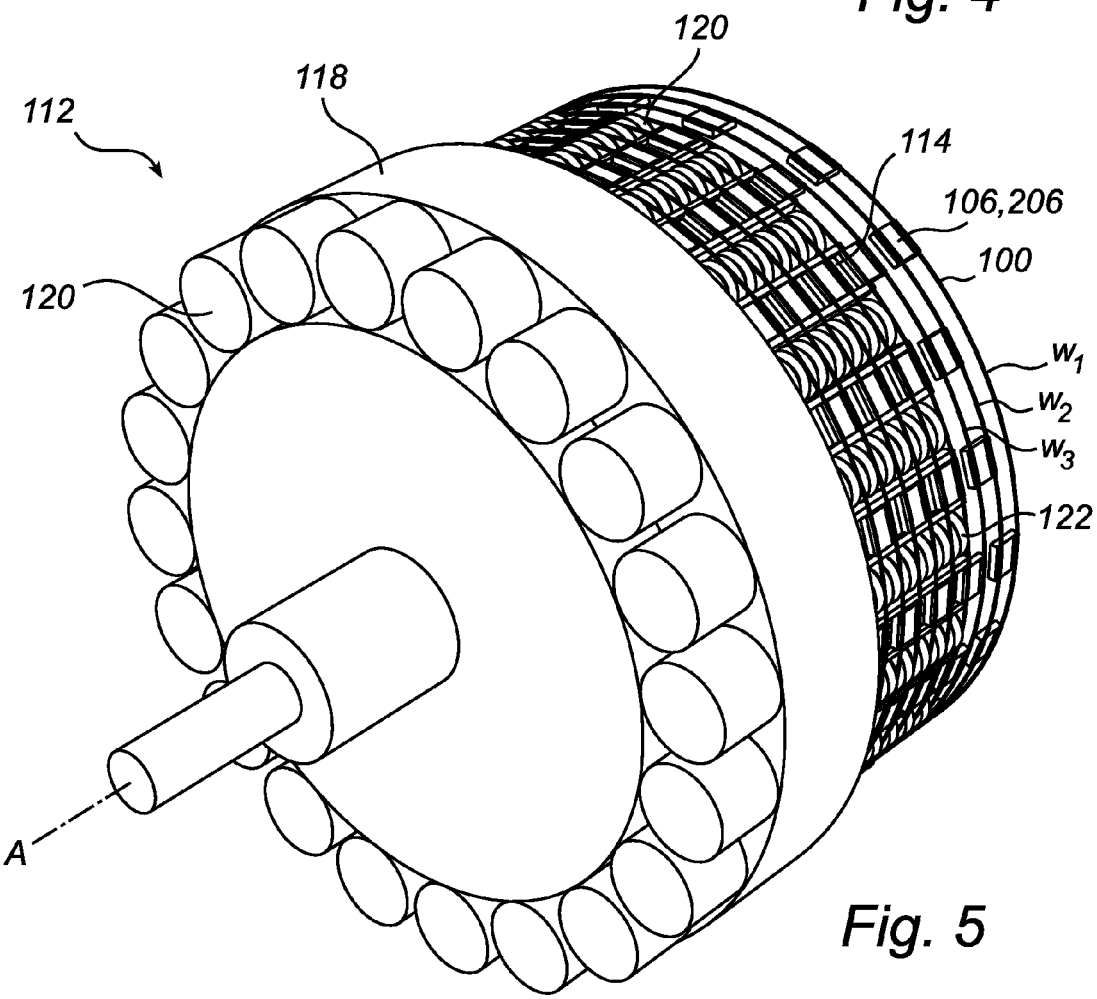
FIG. 5 is a perspective view from behind of the device of FIG. 4.

FIG. 5 shows the assembly drum 112 from behind, and also shows how the LED array grid 100 starts to be fed off the drum.

Figure 6:
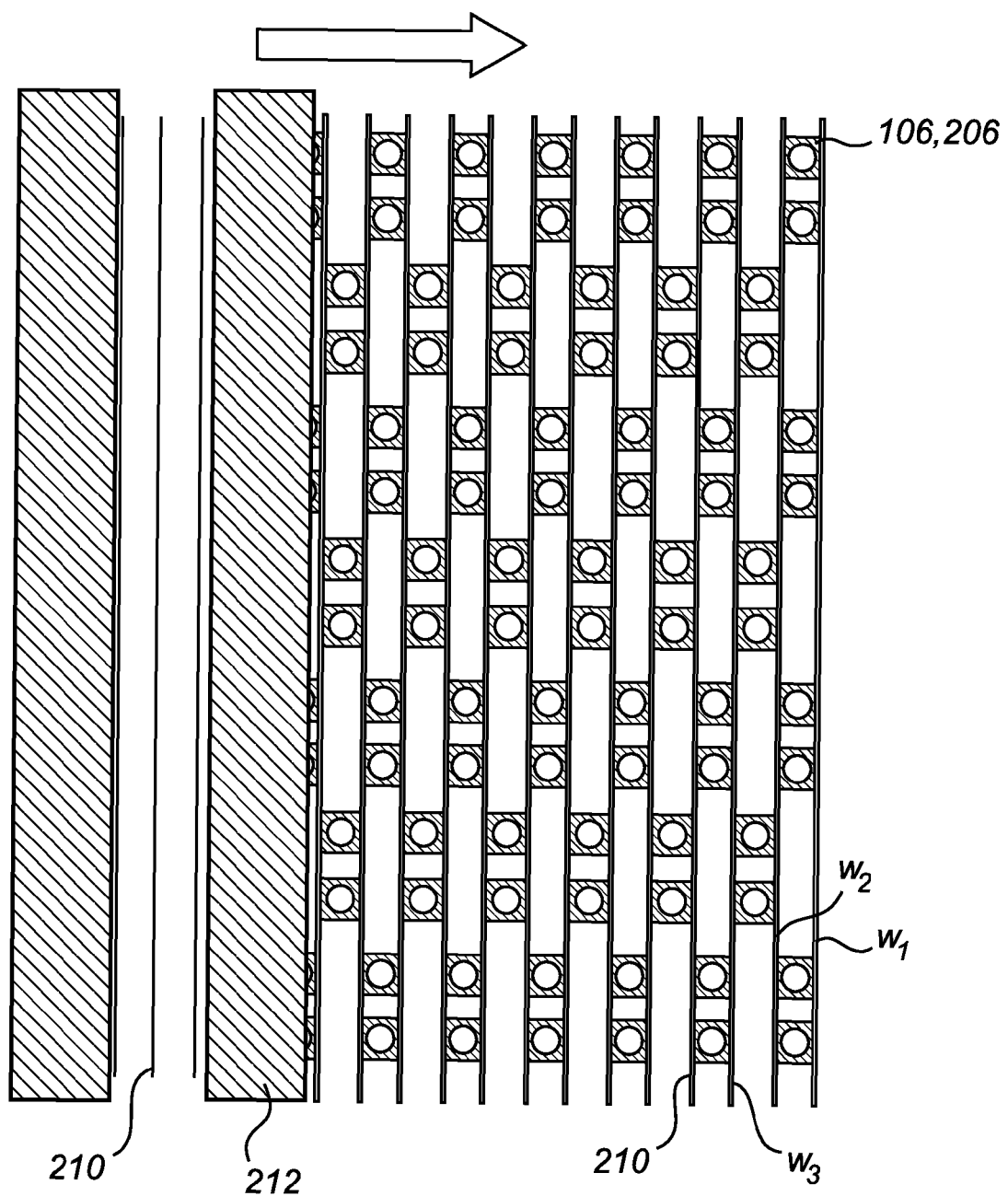
FIG. 6 is a schematic view of an alternative embodiment of the inventive method.

The assembly process as described has some advantages regarding the simplicity of surrounding equipment such as the component feed and the soldering device. However, the inventive idea could also be realised in a planar approach, as schematically shown in FIG. 6, in which the single wound wire 110 and the assembly drum 112 is replaced by several individual, parallel wires 210 being fed in a plane to a mounting area 212 where LED components 106, 206 are attached along the length of the wires 210. The arrow in FIG. 6 indicates the feeding direction. Just like in the previously mentioned embodiment, the resulting LED array grid 100 can be stretched to a desired length, which obviously is dependent the distribution of LED components 106, 206 on the LED array grid. This planar approach has an advantage in that the width of the final LED array grid potentially is more easy to vary, in terms of production equipment. From the above description of the assembly using an assembly drum features not specifically related to the use of a drum, also can be applied to the planar approach Note that the described and showed distribution of LED components on the wire grid is given as an example only. The LED components 106, 206 could equally well be given an alternative distribution, as long as it would enable suitable stretching opportunities. An example of an alternative distribution is that the LED components are placed in alternately in groups of one, which should be read in the context that the LED components 106, 206 in the drawings are arranged alternately in groups of two.

The LED array grid that is created with the inventive method is extremely cost efficient in comparison to a known PCB solution, i.e. a solution in which a PCB forms the entire area of the array grid. The cost for one square meter LED array if a PCB is used will exceed 50 Euro, while the cost for the wire mesh solution is less than 1 Euro.

Suitable, but not exclusive applications for the inventive LED array grid 100 are backlighting for LCD displays, an alternative to compact fluorescent lamps and sphere lighting like light emitting walls or windows.

Figure 7:
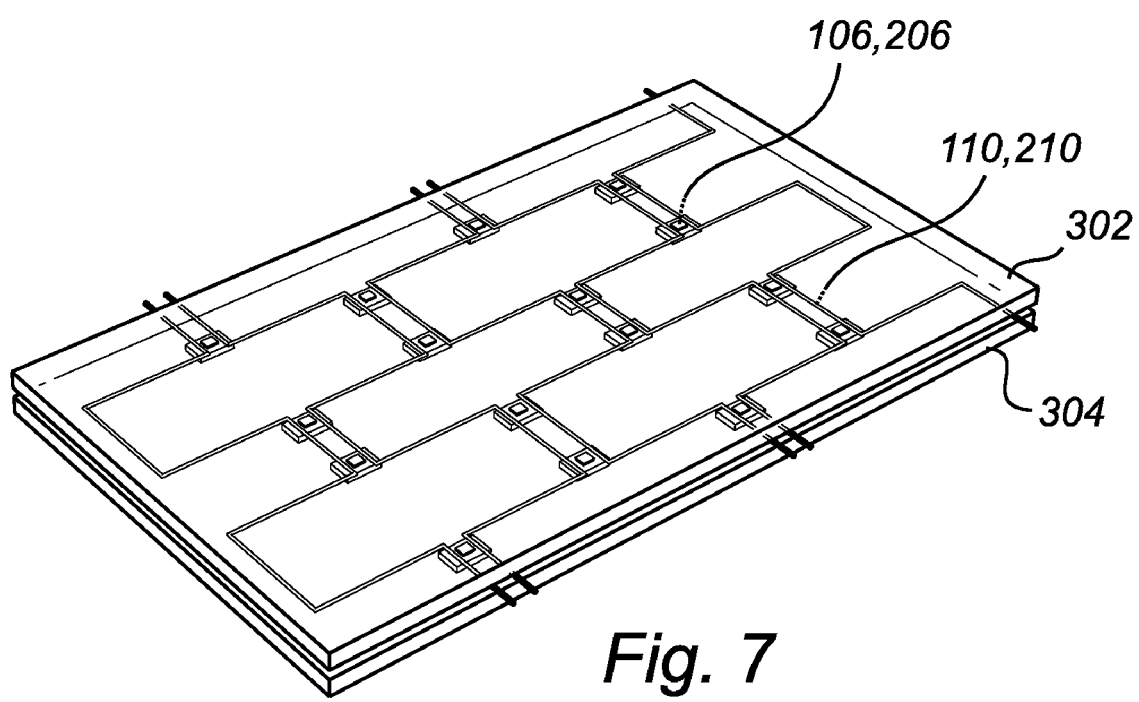
FIG. 7 is a perspective view of a LED array grid according to one embodiment of the invention arranged between two glass plates.

A novel usage includes the arrangement of the LED array grid 100 on a glass plate, or sandwiched between two glass plates 302, 304 as exemplified in FIG. 7. The space between the glass plates can be filled with polyvinyl butyral (PVB). The PVB provides for a strong sandwich structure bonding the glass plates and also reduces reflections thanks to its optical properties. As conductor for the electrical current, a transparent layer on one of the glass plates can be used, such as indium tin oxide (generally called ITO) or fluor doped tin oxide (generally called FTO). The LEDs are bonded to this coated glass, e.g. with conductive adhesive or solder. However, both ITO and FTO possess a high sheet resistance which limits the power of the LEDs, furthermore it is not easy to make a reliable interconnect between LEDs and layers of ITO or FTO, which is why the use of an LED array grid 100 is advantageous from this perspective.

The LED array grids can also be bonded to the glass plate by means of self-bonding wires. Such wires are coated with a first strong isolating layer—this layer has a high melting point (>300° C.)—and a second isolation layer with a lower melting point (<200° C.). This second layer is in case of making coils used for bonding the wires within a coil to make it rigid. The heat can be applied by a current through the wires or by placing the coil in an oven, it is also possible to use a solvent to obtain adhesion. In cases where the LEDs are thinner than the wires the same bonding principle can be used by applying temperature and pressure on the glass-LED sandwich structure.

The use of wires, e.g. a 0.3 mm diameter copper wire as compared to a transparent layer of ITO or FTO gives huge advantages in terms of efficiency, mainly coupled to the much higher resistance per length unit for said transparent layers.

Figure 8A:
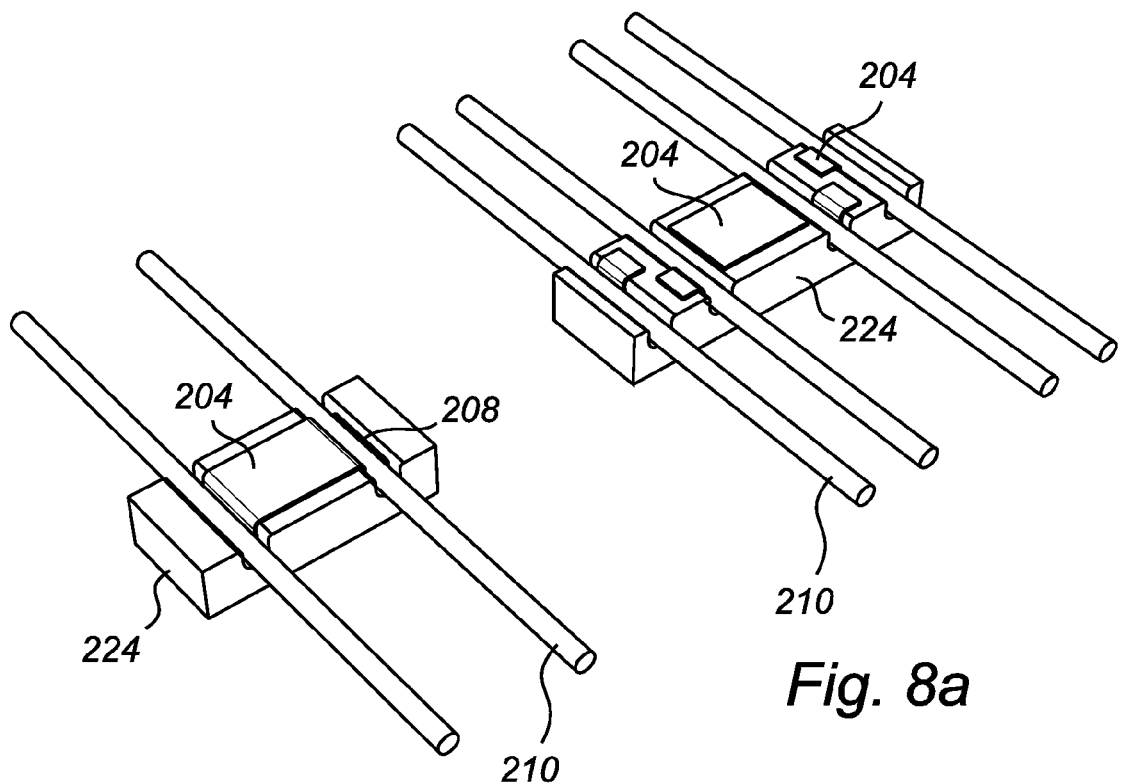
FIGS. 8a and 8b are schematic views illustrating the structure of LED components which are adapted for soldered or glued wires as interconnect.
Figure 8B:
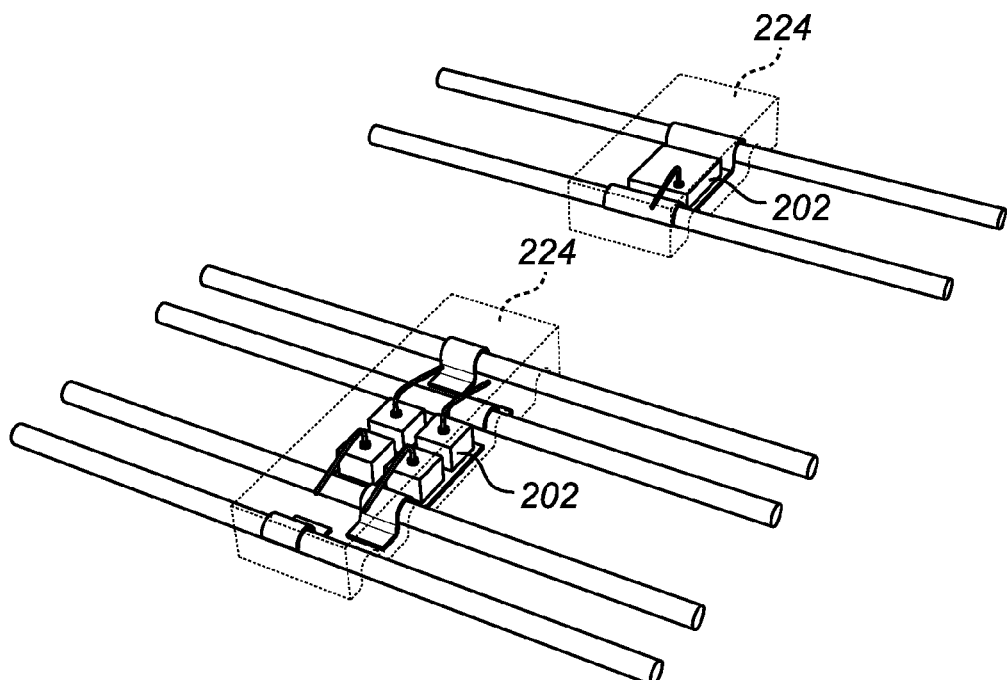

FIGS. 8a and 8b are schematic views exemplifying a LED component construction, or LED package, which is particularly suitable for the purposes of the inventive LED array grid 100, and also the sandwich construction described above. The method for producing the LED package involves the steps of:
  preparing a leadframe material 204 for a substrate,
  folding the substrate in order to obtain various "snap-lock" positions 208 for a wire 210 which will be attached in use,
  placing/interconnecting LEDs 202 by means of wire bonding or flip-chip,
  over moulding with a clear compound 224
  back etch carrier substrate,
  dice into components 306.

The above construction can also comprise a heatsink arranged in thermal contact with the LEDs.

It should be noted that each wire could if needed consist of two, or more, conductors, as illustrated in FIGS. 8a-b.

The invention claimed is:

1. A method for production of an LED array grid, the method comprising the steps of:
  arranging N electrically conducting wires ($W_1$-$W_N$) in parallel, where N is an integer>1, thus creating an array of wires ($W_1$-$W_N$), said array having a width D perpendicular to a length direction of the wires ($W_1$-$W_N$),
  arranging LED components to the array of wires such that each LED component is electrically coupled to at least two wires,
  stretching the array of wires such that the width D increases and a gap is formed between adjacent wires, and
  arranging the stretched LED array grid onto a substrate, wherein the array of wires is formed by winding a wire in a helical fashion around an assembly drum and wherein a winding of the array of wires leaves the assembly drum after the step of arranging each LED component to the two wires, thereby creating a cylinder-shaped grid of wires and LED components.

2. The method of claim 1, wherein the LED components are arranged such that the LED components are distributed at regular intervals after stretching of the grid.

3. The method of claim 2, wherein the LED components are arranged such that, in a direction perpendicular to the length direction of the wires ($W_1$-$W_N$), the stretched LED array grid comprises at least one row of LED components bridging every other gap between adjacent wires.

4. The method of claim 1, further comprising the step of cutting the wire at least once along each winding of the cylinder-shaped grid.

5. The method of claim 1, wherein the LED components are soldered to the wires.

6. The method of claim 1, wherein the LED components include IDC-type fasteners.

7. The method of claim 1, wherein the substrate is a glass plate.

8. The method of claim 1, further comprising the steps of:
  providing a substrate comprising a leadframe material,
  folding the substrate in order to obtain positions for receiving a wire,
  interconnecting LED components by wire bonding or a flip-chip technique, and over moulding the LED components with a clear compound.

9. An illumination system comprising a LED array grid manufactured according to claim 1.

10. The illumination system according to claim 9, wherein the LED array grid is bonded to a glass plate.

11. The illumination system according to claim 9, wherein the wires are self-bonding.

12. A winder device for production of a LED array grid, the device comprising:

(a) rotatable pins extending essentially in the same direction and being arranged along a circumference, thus forming a winding drum, the pins comprising a plurality of threads for positioning an electrically conducting wire being wound around the drum, thereby creating a parallel array of wires, wherein rotation of the pins transports the array of wires along the length of the pins, (b) means for arranging LED components to the array of wires, and (c) means for attaching each LED component to adjacent wires of the array of wires.

13. The winder device of claim 12, further comprising a gear coupling the rotation of the drum to the rotation of each of the pins such that one revolution of the drum results in one revolution of each pin.

14. A method for production of an LED array grid, the method comprising the steps of:

arranging N electrically conducting wires ($W_1$-$W_N$) in parallel, where N is an integer>1, thus creating an array of wires ($W_1$-$W_N$), said array having a width D perpendicular to a length direction of the wires ($W_1$-$W_N$), arranging LED components to the array of wires such that each LED component is electrically coupled to at least two wires, stretching the array of wires such that the width D increases and a gap is formed between adjacent wires, arranging the stretched LED array grid onto a substrate providing a substrate comprising a leadframe material, folding the substrate in order to obtain positions for receiving a wire, interconnecting LED components by wire bonding or a flip-chip technique, and over moulding the LED components with a clear compound.

* * * * *